United States Patent
Paek et al.

(10) Patent No.: US 7,826,584 B2
(45) Date of Patent: Nov. 2, 2010

(54) PHASE LOCKED LOOPS CAPABLE OF BURN-IN TESTING WITH INCREASED LOCKING RANGE AND BURN-IN TESTING METHOD THEREOF

(75) Inventors: Soo-Jin Paek, Suwon-si (KR); Jae-wook Lee, Yongin-si (KR); Ho-keun Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 695 days.

(21) Appl. No.: 11/822,216

(22) Filed: Jul. 3, 2007

(65) Prior Publication Data
US 2008/0112524 A1 May 15, 2008

(30) Foreign Application Priority Data
Nov. 15, 2006 (KR) .................... 10-2006-0113036

(51) Int. Cl.
*H03D 3/24* (2006.01)
*H03L 7/06* (2006.01)
(52) U.S. Cl. ...................... 375/376; 327/147
(58) Field of Classification Search ................ 375/226, 375/373–376; 370/503; 327/147, 156
See application file for complete search history.

(56) References Cited

U.S. PATENT DOCUMENTS

| | | | | |
|---|---|---|---|---|
| 5,926,515 | A * | 7/1999 | Park | 375/376 |
| 5,982,189 | A * | 11/1999 | Motika et al. | 324/763 |
| 6,262,634 | B1 | 7/2001 | Flanagan et al. | |
| 6,384,649 | B1 | 5/2002 | Boerstler et al. | |

FOREIGN PATENT DOCUMENTS

EP    1 152 536 A1    11/2001

* cited by examiner

*Primary Examiner*—Khanh C Tran
(74) *Attorney, Agent, or Firm*—Harness, Dickey & Pierce, P.L.C.

(57) ABSTRACT

In phase locked loop, a phase detector detects a phase difference between a first clock signal and a second clock signal and output a first output signal based on the detected difference. A charge pump generates a control voltage in response to the first output signal from the phase detector. A voltage-controlled oscillator generates the second clock signal. A controller controls the control voltage such that the phase difference between the first clock signal and the second clock signal is increased in response to a burn-in test mode signal.

27 Claims, 4 Drawing Sheets

PHASE LOCKED LOOPS CAPABLE OF BURN-IN TESTING WITH INCREASED LOCKING RANGE AND BURN-IN TESTING METHOD THEREOF

PRIORITY STATEMENT

This non-provisional patent application claims priority under 35 U.S.C. §119 to Korean Patent Application No. 10-2006-0113036, filed on Nov. 15, 2006, in the Korean Intellectual Property Office (KIPO), the entire contents of which is incorporated herein by reference.

BACKGROUND

Description of the Related Art

Related art semiconductor integrated circuits may operate in synchronization with a clock signal. The clock signal may be input through a signal input pin and distributed to components of a device. A clock signal applied to a component further away from the signal input pin may be delayed relative to a clock signal applied to a component closer to the signal input pin, which may cause difficulty in synchronizing operations of components in the device. In the related art, a delay locked loop or a phase locked loop may be used to synchronize clock signals applied to the components of the device.

As related art semiconductor integrated circuits become increasingly integrated, generation rates of defective elements such as transistors may increase, which may decrease yield and/or reliability of related art semiconductor integrated circuits. Related art methods of detecting and repairing defective chips such as a burn-in test may be used to improve yield and/or reliability.

In a related art burn-in test, a relatively high voltage corresponding to a specified (e.g., maximum) chip operating voltage is applied to the chip at a relatively high temperature for a relatively long time. In doing so, the burn-in test may detect a defective chip.

During the related art burn-in test, internal circuits, such as a phase locked loop, of a semiconductor integrated circuit may operate. For example, the phase locked loop may operate at a relatively high frequency in a normal active operation. However, the clock frequency (e.g., the maximum clock frequency) provided by a related art burn-in test apparatus may be lower than the operating frequency of the phase locked loop, and thus, the phase locked loop may not operate normally during testing. As a result, a burn-in test of the phase locked loop may not be performed properly. While a relatively high-frequency related art burn-in test apparatus may properly test the phase locked loop, such a burn-in test apparatus may be relatively expensive.

SUMMARY

Example embodiments relate to semiconductor integrated circuits, for example, phase locked loops capable of burn-in testing with increased locking range and/or aggravated stress and a burn-in testing method thereof.

At least one example embodiment provides a phase locked loop operating at a relatively high speed during burn-in testing. At least one other example embodiment provides a burn-in testing method for a phase locked loop.

According to at least one example embodiment, a phase locked loop may include a phase detector, a charge pump, a voltage-controlled oscillator and/or a controller. The phase detector may be configured to detect a phase difference between a reference clock signal and an internal clock signal. The charge pump may be configured to generate a control voltage in response to the output signal of the phase detector. The voltage-controlled oscillator may be configured to generate the internal clock signal. The internal clock signal may be proportional to the control voltage. The controller may be configured to control the control voltage such that the phase difference between the reference clock signal and the internal clock signal is increased in response to a burn-in test mode signal.

According to at least some example embodiments, the controller may increase the control voltage to a maximum control voltage associated with a relatively stable operation of the phase locked loop and aggravate a stress applied to the phase locked loop such that the reference lock signal may maintain a phase lag behind the phase of the internal clock signal. The controller may decrease the control voltage to a minimum control voltage associated with a relatively stable operation of the phase locked loop and aggravate a stress applied to the phase locked loop such that the reference lock signal may maintain a phase lead relative to the phase of the internal clock signal.

According to at least one example embodiment, a phase locked loop may include a phase detector, a charge pump, a voltage-controlled oscillator, a level detector, a controller, a first and second delay, and/or a first and a second multiplexer. The phase detector may be configured to detect a phase difference between a first clock signal and a second clock signal. The charge pump may be configured to generate a control voltage in response to the output signal from the phase detector. The voltage-controlled oscillator may be configured to generate an internal clock signal. The internal clock signal may be proportional to the control voltage. The level detector may be configured to detect the level of the control voltage. The controller may be configured to generate a first select signal and a second select signal in response to a burn-in test mode signal and the output signal of the level detector.

According to at least this example embodiment, the first delay may be configured to delay the internal clock signal by a first delay time. The second delay may be configured to delay the internal clock signal by a second delay time. The first multiplexer may be configured to output one of a reference clock signal and the output signal of the first delay as the first clock signal in response to the first select signal. The second multiplexer may be configured to output one of the internal clock signal and the output signal of the second delay as the second clock signal in response to the second select signal. The second delay time may be longer than the first delay time.

According to at least some example embodiments, the phase difference between the first clock signal and the second clock signal may be increased to raise the control voltage to a first threshold voltage. The first threshold voltage may correspond to a maximum control voltage associated with a relatively stable operation of the phase locked loop. A stress applied to the phase locked loop may be aggravated such that the first lock signal may maintain a phase lag behind the phase of the second clock signal.

According to at least some example embodiments, the phase difference between the first clock signal and the second clock signal may be increased to decrease the control voltage to a second threshold voltage. The second threshold voltage may correspond to a minimum control voltage associated with a relatively stable operation of the phase locked loop. A stress applied to the phase locked loop may be aggravated such that the first lock signal maintains a phase lead relative to the phase of the second clock signal.

At least one other example embodiment provides a burn-in test method for a phase locked loop. According to at least this example embodiment, a first phase difference between a reference clock signal and an internal clock signal may be detected and a control signal may be generated based on the detected first phase difference. The internal clock signal may be proportional to the control voltage. The control voltage may be increased to a maximum control voltage associated with relatively stable operation of the phase locked loop in response to a burn-in test mode signal. A second phase difference between a reference clock signal and an internal clock signal may be detected and a control signal may be generated based on the detected second phase difference. The control voltage may be decreased to a minimum control voltage associated with a relatively stable operation of the phase locked loop.

According to at least some example embodiments, a stress applied to the phase locked loop may be aggravated such that the reference lock signal maintains a phase lag behind the phase of the internal clock signal. Alternatively, the stress applied to the phase locked loop may be aggravated such that the reference lock signal maintains a phase lead relative to the phase of the internal clock signal. The aggravating of the stress may be repeated, for example, alternately.

At least one other example embodiment provides a burn-in test method of a phase locked loop. According to at least this method, a phase difference between a first clock signal and a second clock signal may be detected, and a control voltage may be generated based on the output signal of the phase detector. An internal clock signal proportional to the control voltage may be generated and the internal clock signal may be delayed by a first delay time to generate a first delayed internal clock signal. The internal clock signal may be delayed by a second delay time to generate a second delayed internal clock signal and the level of the control voltage may be detected. A first select signal and a second select signal may be generated in response to a burn-in test mode signal and the control voltage. One of a reference clock signal and the first delayed internal clock signal may be output as the first clock signal in response to the first select signal, and one of the internal clock signal and the second delayed internal clock signal may be output as the second clock signal in response to the second select signal.

At least one other example embodiment provides a phase locked loop. In at least this example embodiment, a phase detector may be configured to detect a phase difference between a first clock signal and a second clock signal and output a first output signal based on the detected difference. A charge pump may be configured to generate a control voltage in response to the first output signal from the phase detector. A voltage-controlled oscillator may be configured to generate the second clock signal. The second clock signal may be proportional to the control voltage. A controller may be configured to control the control voltage such that the phase difference between the first clock signal and the second clock signal increases in response to a burn-in test mode signal.

At least one other example embodiment provides a burn-in test method for a phase locked loop. According to at least this example embodiment, an internal clock signal proportional to a control voltage may be generated. The control voltage may be generated based on a detected phase difference between a reference clock signal and an internal clock signal, and the control voltage may be less than a first voltage level. The control voltage may be increased in response to a first burn-in test mode signal. The generating and increasing may be repeated until the control voltage is equal or substantially equal to the first voltage level.

Phase locked loops according to at least some example embodiments may internally generate clock signals used during a burn-in test to reduce chip area overhead. Furthermore, phase locked loops according to at least some example embodiments may maintain a lead phase state or a lag phase state during a burn-in test and/or alternate the lead phase state and the lag phase state to maximize the locking range and/or aggravate a stress applied thereto.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
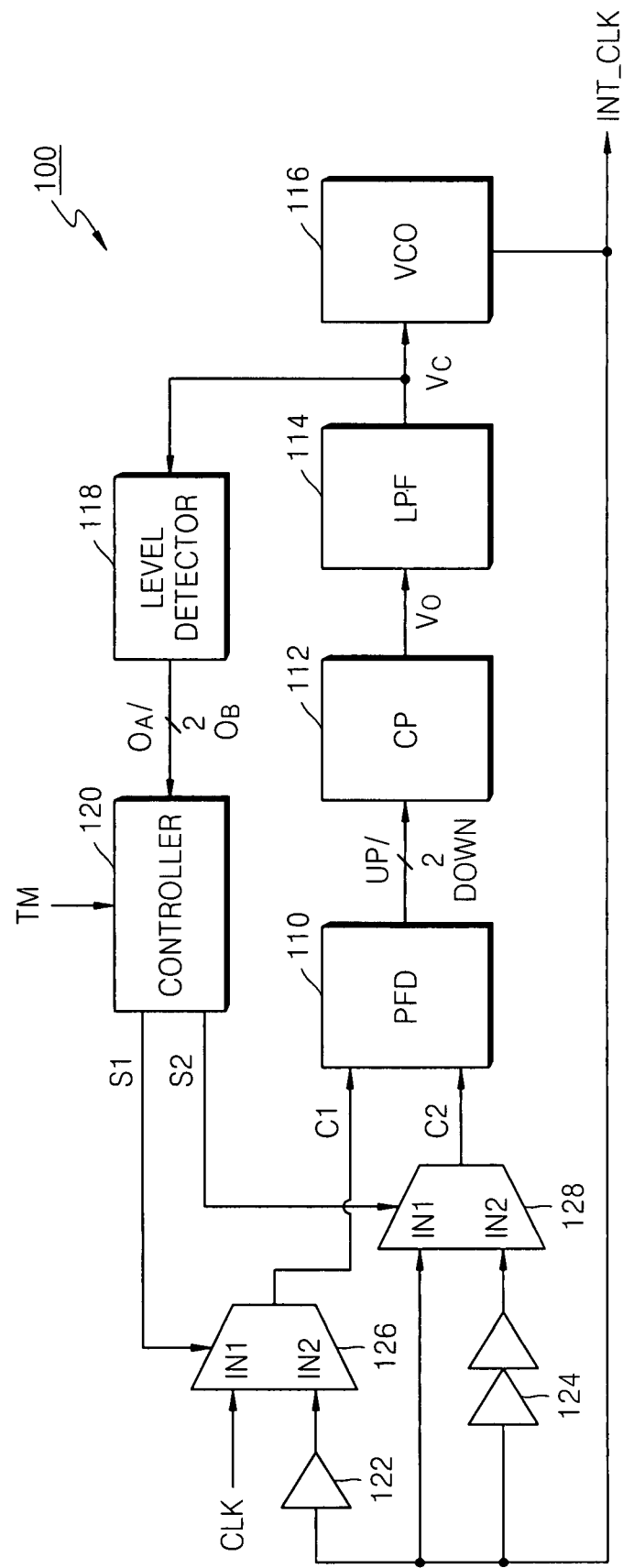
FIG. 1 illustrates a phase locked loop according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates a phase locked loop according to an example embodiment. Referring to FIG. 1, the phase locked loop 100 may include a phase detector 110, a charge pump 112, a loop filter 114 and/or a voltage-controlled oscillator 116. The phase detector 110 may detect a difference between a first clock signal C1 and a second clock signal C2, and generate an up signal UP or a down signal DOWN based on the detected difference. The charge pump 112 may generate a given output voltage Vo in response to the up signal UP or the down signal DOWN. The loop filter 114 may suppress (e.g., remove) a noise component from the output voltage Vo of the charge pump 112 to generate a control voltage Vc. The control voltage Vc may be output to the voltage-controlled oscillator 116. The voltage-controlled oscillator 116 may generate an internal clock signal INT_CLK based on the control voltage Vc. The internal clock signal INT_CLK may have a frequency proportional to the control voltage Vc.

The phase locked loop 100 may further include a level detector 118 and/or a controller 120. The level detector 118 may be configured to detect the level of the control voltage Vc and generate output signals $O_A$ and $O_B$ based on the detected level of the control voltage Vc. The controller 120 may generate first and second select signals S1 and S2 in response to a burn-in test mode signal TM and the output signal from the level detector 118. A first delay 122 may delay the internal clock signal INT_CLK by a first delay time to generate a first delayed internal clock signal, and a second delay 124 may delay the internal clock signal INT_CLK by a second delay time to generate a second delayed internal clock signal. The first delayed internal clock signal may be output to a multiplexer 126, and the second delayed internal clock signal may be output to a multiplexer 128.

The first multiplexer 126 may output one of a reference clock signal CLK and the first delayed internal clock signal as a first clock signal C1 in response to the first select signal S1. The second multiplexer 128 may output one of the internal clock signal INT_CLK and the second delayed internal clock signal from the second delay 124 as a second clock signal C2 in response to the second select signal S2.

According to at least some example embodiments, the phase locked loop 100 may operate in one of a normal mode and a burn-in test mode.

In the normal mode, the controller 120 may generate the first and second select signals S1 and S2 at a logic low level, for example, in response to deactivation of the burn-in test mode signal TM. The first multiplexer 126 may output the reference clock signal CLK (input to a first input terminal IN1) as the first clock signal C1 in response to the first select signal S1 having a logic low level. The second multiplexer 128 may output the internal clock signal INT_CLK (input to a first input terminal IN1) as the second clock signal C2 in response to the second clock signal S2 having a logic low level.

The phase detector 110 may detect a phase difference between the reference clock signal CLK and the internal clock signal INT_CLK and generate the up signal UP or the down signal DOWN based on the detected difference. The charge pump 112 and the loop filter 114 may generate the control voltage Vc in response to the up signal UP or the down signal DOWN. The voltage-controlled oscillator 116 may generate the internal clock signal INT_CLK based on or in response to the control voltage Vc. A feedback operation of a loop including the phase detector 110, the charge pump 112, the loop filter 114 and/or the voltage-controlled oscillator 116 may be repeated until the phase of the internal clock signal INT_CLK becomes the same or substantially the same as the phase of the reference clock signal CLK.

Figure 2:
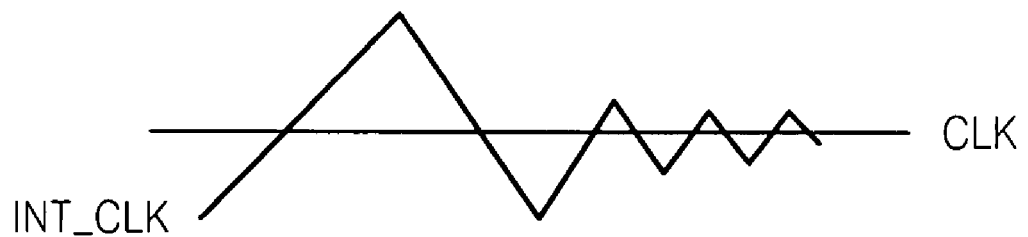
FIGS. 2 and 3 are diagrams illustrating an example normal active operation of a phase locked loop according to an example embodiment.
Figure 3:
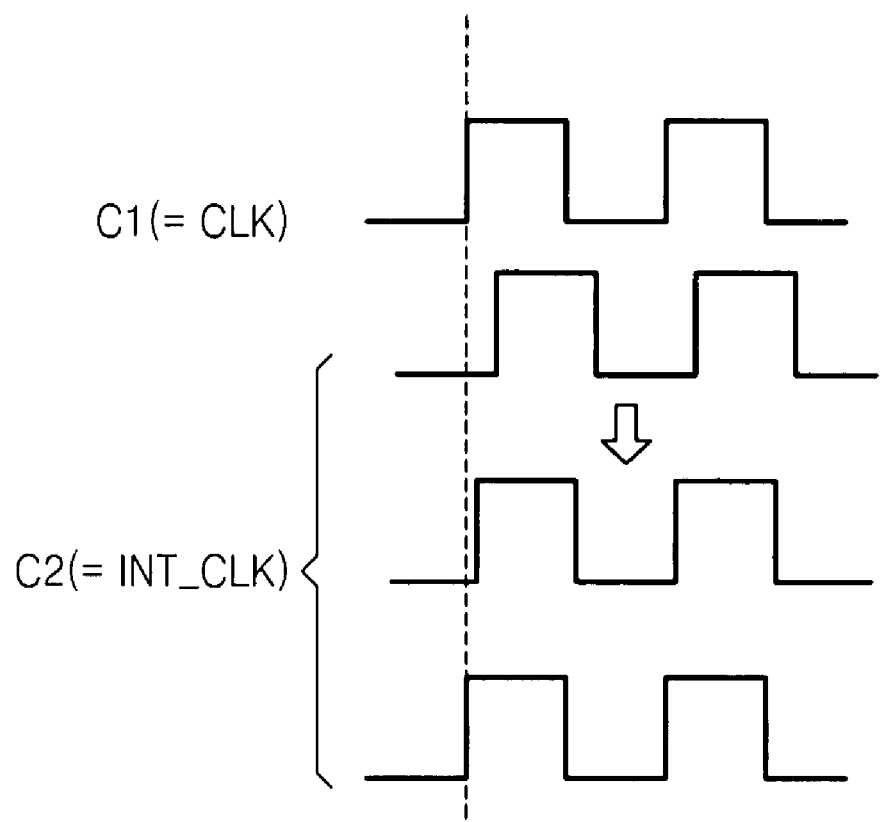

According to at least some example embodiments, an initial (e.g., relatively large) phase difference between the internal clock signal INT_CLK and the reference clock signal may CLK gradually decrease, and the phases of these two clock signals may become the same or substantially the same as illustrated in FIGS. 2 and 3.

As noted above, the PLL 100 may also operate in a burn-in test mode. In the burn-in test mode, the controller 120 may generate first and second select signals S1 and S2 at a logic high level, for example, in response to activation of the burn-in test mode signal TM and the output signals $O_A$ and $O_B$ from the level detector 118.

Figure 4:
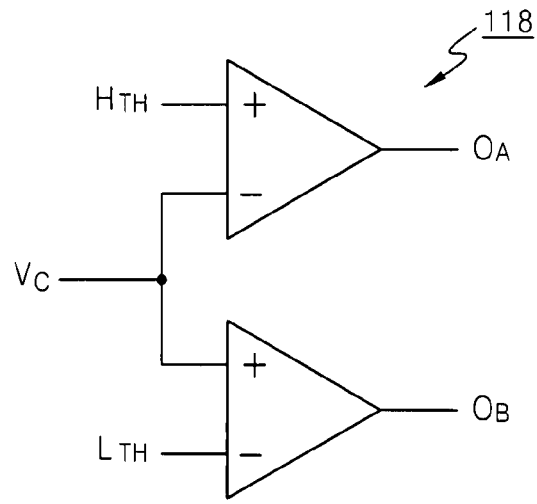
FIG. 4 is a circuit diagram of a level detector according to an example embodiment.

Referring to FIG. 4, the level detector 118 may include a first comparator 410 and a second comparator 412. The first comparator 410 may be configured to compare the control voltage Vc with a first threshold voltage $H_{TH}$. The second comparator 412 may be configured to compare the control voltage Vc with a second threshold voltage $L_{TH}$. The first and second threshold voltages $H_{TH}$ and $L_{TH}$ may correspond to maximum and minimum control voltages Vc associated with a relatively stable operation of the phase locked loop 100 illustrated in FIG. 1.

Figure 5:
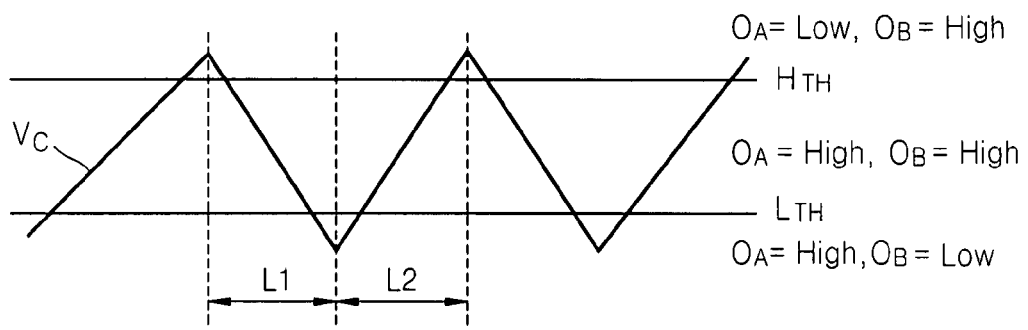
FIG. 5 is a diagram illustrating an example operation of a level detector according to an example embodiment.
Figure 6:
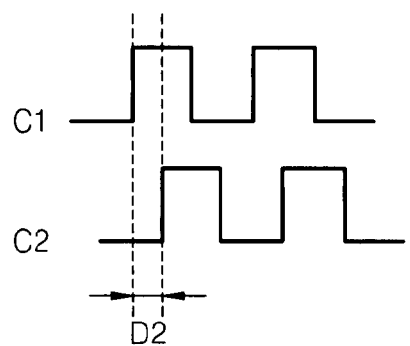
FIGS. 6 and 7 are waveform diagrams illustrating a burn-in test operation of a phase locked loop according to an example embodiment.
Figure 7:
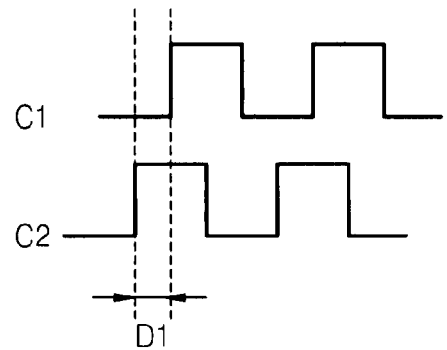

An example operation of the level detector 188 will be explained in more detail with reference to FIGS. 4 and 5.

When the control voltage Vc is lower than the second threshold voltage $L_{TH}$, the first comparator 410 may generate output signal $O_A$ at a logic high level and the second comparator 412 may generate output signal $O_B$ at a logic low level. When the control voltage Vc is lower than the first threshold voltage $H_{TH}$ and higher than the second threshold voltage $L_{TH}$, the first comparator 410 may generate output signal $O_A$ at a logic high level and the second comparator 412 may generate output signal $O_B$ having a logic high level. When the control voltage Vc is higher than the first threshold voltage $H_{TH}$, the first comparator 410 may generate output signal $O_A$ at a logic low level and the second comparator 412 may generate output signal $O_B$ at a logic high level.

In the burn-in test mode, the control voltage Vc may be controlled such that the control voltage Vc corresponds to the first threshold voltage $H_{TH}$ or the second threshold voltage $L_{TH}$ to aggravate a stress applied to the phase locked loop 100. In a first test mode TM1, the control voltage Vc may be decreased from the first threshold voltage $H_{TH}$ to the second threshold voltage $L_{TH}$. In a second test mode TM2, the control voltage Vc may be increased from the second threshold voltage $L_{TH}$ to the first threshold voltage $H_{TH}$.

In the first test mode TM1, the controller 120 may generate the first select signal S1 at a logic high level and the second select signal S2 at a logic high level. The first multiplexer 126 may output the first delayed internal clock signal from the first delay 122 as the first clock signal C1 in response to the first select signal S1. The second multiplexer 128 may output the second delayed internal clock signal from the second delay 124 as the second clock signal C2 in response to the second select signal S2.

Accordingly, the first clock signal C1 having a phase leading that of the second clock signal C2 by a delay difference D2 between the first and second delays 122 and 124 may be input to the phase detector 110. In this example, the phase detector 110 may generate the down signal DOWN, and the charge pump 112 and the loop filter 114 may reduce the control voltage Vc to the second threshold voltage $L_{TH}$ in response to the received down signal DOWN. For example, the first test mode TM1 may aggravate a stress applied to the phase locked loop such that the first clock signal C1 input to the phase detector 110 may maintain a phase leading the phase of the second clock signal C2 by the delay difference D2 between the first and second delays 122 and 124.

Referring back to FIG. 5, in the second test mode TM2, the controller 120 may generate the first select signal S1 at a logic high level and the second select signal S2 at a logic low level. The first multiplexer 126 may output the first delayed internal clock signal as the first clock signal C1 in response to the first select signal S1. The second multiplexer 128 may output the internal clock signal INT_CLK as the second clock signal C2 in response to the second select signal S2.

In this example, the first clock signal C1 having a phase lagging behind the phase of the second clock signal C2 by a delay time D1 of the first delay 122 may be input to the phase detector 110. The phase detector 110 may generate the up signal UP, and the charge pump 112 and the loop filter 114 may increase the control voltage Vc to the first threshold voltage $H_{TH}$ in response to the up signal UP. In this example, the second test mode TM2 may aggravate a stress applied to the phase locked loop such that the first clock signal C1 input to the phase detector 110 may maintain a phase lagging behind the phase of the second clock signal C2 by the delay time D1 of the first delay 122.

In the first and second test modes TM1 and TM2, the first and second clock signals C1 and C2 may be derived from the internal clock signal INT_CLK. For example, clock signals used for the burn-in test may be internally generated in the phase locked loop, and the phase locked loop need not include an additional circuit, thereby reducing overhead of chip area.

Figure 8:
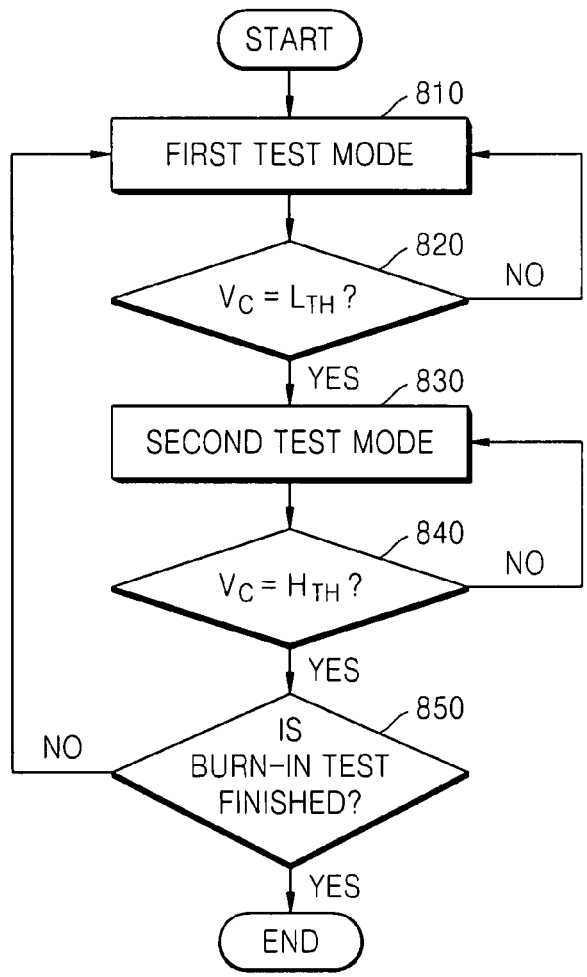
FIG. 8 is a flow chart illustrating a burn-in test method for a phase locked loop according to an example embodiment.

FIG. 8 illustrates a burn-in test method according to an example embodiment.

Referring to FIG. 8, a phase locked loop (e.g., the phase locked loop 100 illustrated in FIG. 1) may be tested in a first test mode at S810. Testing in the first test mode at S810 maybe repeated until the control voltage Vc is the same or substantially the same as the second threshold voltage $L_{TH}$. For example, the phase locked loop 100 may be tested in the first test mode at S810, and the control voltage Vc may be compared to the second threshold voltage $L_{TH}$ at S820. If the control voltage Vc is not equal or substantially equal to the second threshold voltage $L_{TH}$, the process may return to S810 and repeat.

If the control voltage Vc is the same or substantially the same as the second threshold voltage $L_{TH}$ at S820, the phase locked loop 100 may be tested in the second test mode at S830.

The testing in the second test mode at S830 may be repeated until the control voltage Vc reaches the first threshold voltage $H_{TH}$ in the operation S840. For example, the phase locked loop 100 may be tested in the second test mode at S830, and the control voltage Vc may be compared to the first threshold voltage $H_{TH}$ at S840. If the control voltage Vc is not equal or substantially equal to the first threshold voltage $H_{TH}$, the process may return to S830 and repeat.

When the control voltage Vc becomes the same or substantially the same as the first threshold voltage $H_{TH}$, the phase locked loop 100 may be tested in the first test mode until the burn-in test is completed at S850. For example, at S850, if the burn-in test is not completed, the process may return to S810 and repeat. Returning to S850, if the burn-in test is completed, the process may terminate.

Example embodiments may maintain a lead phase state or a lag phase state of the phase locked loop during a burn-in test and/or alternate the lead phase state and the lag phase state to increase (e.g., maximize) the locking range of the phase locked loop. Consequently, a stress applied to the phase locked loop may be aggravated.

While example embodiments have been particularly shown and described with reference to the example embodiments shown in the figures, it will be understood by those of ordinary skill in the art that various changes in form and details may be made therein without departing from the spirit and scope of the present invention as defined by the following claims.

What is claimed is:

1. A phase locked loop comprising:
    a phase detector configured to detect a phase difference between a first clock signal and a second clock signal and output a first output signal based on the detected difference, the second clock signal being based on a third clock signal;
    a charge pump configured to generate a control voltage based on the first output signal;
    a voltage-controlled oscillator configured to generate the third clock signal, the third clock signal being proportional to the control voltage; and
    a controller configured to control the control voltage such that the phase difference between the first clock signal and the second clock signal increases in response to a burn-in test mode signal.

2. The phase locked loop of claim 1, wherein the controller increases the control voltage to a maximum control voltage associated with a stable operation of the phase locked loop.

3. The phase locked loop of claim 2, wherein the controller aggravates a stress applied to the phase locked loop such that the first clock signal maintains a phase lag behind the phase of the second clock signal.

4. The phase locked loop of claim 1, wherein the controller decreases the control voltage to a minimum control voltage associated with a stable operation of the phase locked loop.

5. The phase locked loop of claim 4, wherein the controller aggravates a stress applied to the phase locked loop such that the first clock signal maintains a phase lead the phase of the second clock signal.

6. The phase locked loop of claim 1, further including,
a level detector configured to detect the level of the control voltage and output a second output signal based on the detected level,
the controller configured to generate a first select signal and a second select signal in response to a burn-in test mode signal and the second output signal,
a first delay circuit configured to delay the third clock signal by a first delay time to generate a first delayed clock signal,
a second delay circuit configured to delay the third clock signal by a second delay time to generate a second delayed clock signal,
a first multiplexer configured to output one of a reference clock signal and the first delayed clock signal as the first clock signal in response to the first select signal, and
a second multiplexer configured to output one of the third clock signal and the second delayed clock signal as the second clock signal in response to the second select signal.

7. The phase locked loop of claim 6, wherein the second delay time is longer than the first delay time.

8. The phase locked loop of claim 6, wherein the phase difference between the first clock signal and the second clock signal is increased to raise the control voltage to a first threshold voltage.

9. The phase locked loop of claim 8, wherein the first threshold voltage corresponds to a maximum control voltage associated with a stable operation of the phase locked loop.

10. The phase locked loop of claim 9, wherein a stress applied to the phase locked loop is aggravated such that the first clock signal maintains a phase lag behind the phase of the second clock signal.

11. The phase locked loop of claim 6, wherein the phase difference between the first clock signal and the second clock signal is increased to decrease the control voltage to a second threshold voltage.

12. The phase locked loop of claim 11, wherein the second threshold voltage corresponds to a minimum control voltage associated with a stable operation of the phase locked loop.

13. The phase locked loop of claim 12, wherein a stress applied to the phase locked loop is aggravated such that the first clock signal maintains a phase lead relative to the phase of the second clock signal.

14. A burn-in test method of a phase locked loop, the method comprising:
detecting a phase difference between a first clock signal and a second clock signal and outputting a first output signal based on the detected difference, the second clock signal being based on a third clock signal;
first generating a control voltage based on the first output signal;
second generating the third clock signal based on the control voltage, the third clock signal being proportional to the control voltage; and
controlling the control voltage such that the phase difference between the first clock signal and the second clock signal varies in response to a burn-in test mode signal.

15. The method of claim 14, further including,
repeating the detecting, first generating, second generating and controlling until the control voltage is equal to a threshold voltage.

16. The method of claim 15, wherein the threshold voltage is a maximum voltage level.

17. The burn-in test method of claim 15, wherein first repeating aggravates a stress applied to the phase locked loop such that the first clock signal maintains a phase lag behind the phase of the second clock signal.

18. The method of claim 15, wherein the threshold voltage is a minimum voltage level.

19. The burn-in test method of claim 15, wherein the repeating aggravates a stress applied to the phase locked loop such that the first clock signal maintains a phase lead the phase of the second clock signal.

20. The burn-in test method claim 14, further including,
delaying the third clock signal by a first delay time to generate a first delayed internal clock signal,
delaying the third clock signal by a second delay time to generate a second delayed internal clock signal,
detecting a level of the control voltage,
generating a first select signal and a second select signal in response to the first burn-in test mode signal and the control voltage,
outputting one of a reference clock signal and the first delayed internal clock signal as the first clock signal in response to the first select signal; and
outputting one of the third clock signal and the second delayed internal clock signal as the second clock signal in response to the second select signal.

21. The burn-in test method of claim 20, wherein the second delay time is longer than the first delay time.

22. The burn-in test method of claim 20, wherein the phase difference between the first clock signal and the second clock signal is increased to raise the control voltage to a first threshold voltage.

23. The burn-in test method of claim 22, wherein the first threshold voltage corresponds to a maximum control voltage associated with a stable operation of the phase locked loop.

24. The burn-in test method of claim 23, wherein a stress applied to the phase locked loop is aggravated such that the first lock signal maintains a phase lag behind the phase of the second clock signal.

25. The burn-in test method of claim 20, wherein the phase difference between the first clock signal and the second clock signal is increased to decrease the control voltage to a second threshold voltage.

26. The burn-in test method of claim 25, wherein the second threshold voltage corresponds to a minimum control voltage associated with a stable operation of the phase locked loop.

27. The burn-in test method of claim 26, wherein a stress applied to the phase locked loop is aggravated such that the first lock signal maintains a phase lead relative to a phase of the second clock signal.

* * * * *